US008542244B2

(12) United States Patent
Kempf et al.

(10) Patent No.: US 8,542,244 B2
(45) **Date of Patent: *Sep. 24, 2013**

(54) SYSTEM AND METHOD TO GENERATE MULTIPRIMARY SIGNALS

(71) Applicant: Texas Instruments Incorporated, Dallas, TX (US)

(72) Inventors: Jeffrey Kempf, Allen, TX (US); Rajeev Ramanath, Cupertino, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/669,112

(22) Filed: Nov. 5, 2012

(65) Prior Publication Data

US 2013/0063470 A1 Mar. 14, 2013

Related U.S. Application Data

(63) Continuation of application No. 11/604,599, filed on Nov. 27, 2006, now Pat. No. 8,305,391.

(51) Int. Cl.

| | |
|---|---|
| ***G09G 3/30*** | (2006.01) |
| ***G09G 5/10*** | (2006.01) |
| ***G09G 5/02*** | (2006.01) |
| ***G09G 3/34*** | (2006.01) |
| ***G03F 3/08*** | (2006.01) |
| ***H04N 5/66*** | (2006.01) |
| ***H04N 5/46*** | (2006.01) |
| ***G06K 9/40*** | (2006.01) |
| ***G06K 9/36*** | (2006.01) |
| ***G06K 9/32*** | (2006.01) |
| ***H04N 9/64*** | (2006.01) |
| ***H04N 1/46*** | (2006.01) |
| *G09G 3/36* | (2006.01) |
| *H04N 5/202* | (2006.01) |
| *G06K 9/00* | (2006.01) |

(52) U.S. Cl.

USPC ............... 345/589; 345/77; 345/84; 345/600; 345/690; 345/643; 348/254; 348/383; 348/557; 348/571; 348/708; 358/518; 358/525; 382/167; 382/254; 382/276; 382/300; 382/274

(58) Field of Classification Search

USPC ....... 345/55, 84–87, 105, 108, 581, 589–591, 345/593–595, 596, 600–601, 603, 606, 612–613, 345/619, 643, 644, 530, 547–549, 204, 207, 345/690–692, 22, 48, 63, 72, 76–77, 89; 348/38, 41, 68–71, 241–242, 253–254, 256, 348/263, 277, 383, 519, 553, 557, 560, 571, 348/575, 582, 612, 624, 630, 671–675, 708, 348/716–717, 728, 739, 758–761, 807–808; 358/509–512, 518–519, 525, 534, 447–448; 382/162, 166–167, 254, 274, 276, 300, 305; 359/237

See application file for complete search history.

(56) References Cited

U.S. PATENT DOCUMENTS 4,566,935 A 1/1986 Hornbeck
4,615,595 A 10/1986 Hornbeck (Continued)

*Primary Examiner* — Wesner Sajous

(74) *Attorney, Agent, or Firm* — Warren L. Franz; Wade J. Brady, III; Frederick J. Telecky, Jr.

(57) ABSTRACT

System and method for generating multiprimary signals with optimization for bit depth for use in display devices. A preferred embodiment comprises converting an input color signal into an output color signal, wherein the number of colors in the output color signal is less than a number of colors used in a display system, when a weighting of the input color signal is less than a specified threshold, and converting the input color signal into an output color signal, wherein the number of colors in the output color signal is equal to the number of colors used in the display system, when the weighting of the input color signal is greater than the specified threshold. The use of fewer colors eliminates low bit depth colors, allowing increased dither quality in dimmer images.

13 Claims, 5 Drawing Sheets

(56) References Cited

U.S. PATENT DOCUMENTS

| | | | | |
|---|---|---|---|---|
| 4,662,746 | A | 5/1987 | Hornbeck | |
| 5,061,049 | A | 10/1991 | Hornbeck | |
| 5,083,857 | A | 1/1992 | Hornbeck | |
| 5,096,279 | A | 3/1992 | Hornbeck | |
| 5,225,875 | A * | 7/1993 | Shapiro et al. | 345/690 |
| 5,583,688 | A | 12/1996 | Hornbeck | |
| 6,535,187 | B1 | 3/2003 | Wood | |
| 6,571,010 | B1 | 5/2003 | Inoue | |
| 7,358,976 | B2 | 4/2008 | Hampshire et al. | |
| 7,408,558 | B2 | 8/2008 | Madden et al. | |
| 7,598,961 | B2 | 10/2009 | Higgins | |
| 7,835,574 | B2 * | 11/2010 | Ramanath | 382/167 |
| 8,305,391 | B2 * | 11/2012 | Ramanath et al. | 345/591 |
| 2004/0140972 | A1 * | 7/2004 | Hirota et al. | 345/204 |
| 2006/0007406 | A1 * | 1/2006 | Adkins et al. | 353/82 |
| 2006/0103862 | A1 * | 5/2006 | Kurumisawa et al. | 358/1.9 |
| 2011/0242392 | A1 * | 10/2011 | Chiang | 348/333.1 |

* cited by examiner

SYSTEM AND METHOD TO GENERATE MULTIPRIMARY SIGNALS

CROSS-REFERENCE TO RELATED APPLICATIONS

This application is a continuation of application Ser. No. 11/604,599, filed Nov. 27, 2006 (now U.S. Pat. No. 8,305,391) and includes subject matter related to the subject matter of application Ser. No. 11/403,493, filed Apr. 13, 2006 (now U.S. Pat. No. 7,835,574), the entireties of both of which are hereby incorporated by reference.

TECHNICAL FIELD

The present invention relates generally to a system and method for displaying images, and more particularly to a system and method for generating multiprimary signals with optimization for bit depth for use in display devices.

BACKGROUND

Video input to a typical display system, such as a digital micromirror device (DMD) based display system, is usually in the form of stimuli containing three driving signals, such as luma-chroma (YUV), luma-chroma (blue)-chroma (red) (YCbCr), YPbPr, red-green-blue (RGB), and so forth. The stimuli with three driving signals can be expressed as three-dimensional color vectors. However, display systems that are multiprimary use stimuli that, in general, use N driving signals, where N is greater than or equal to three. Therefore, there is a need to convert the stimuli with three driving signals (the video input) into the stimuli with N driving signals used by the multiprimary display system (the display output).

The stimuli with N driving signals can then be displayed by the multiprimary display system. For example, in a single-chip DMD-based display system, the display system will sequentially display the colors of the stimuli and set individual micromirrors in the DMD to states that correspond to image data of an image being displayed. The image data used to set the states of the micromirrors also corresponds to the color currently being displayed by the display system. For instance, if the display system is displaying the color red, then only image data associated with the color red is being used to set the states of the micromirrors in the DMD.

Unless a desired color (or gray scale) being displayed is a sufficiently close match for the output of the display system, dithering (spatial and/or temporal) can be required to visually create the color. Dithering can make use of the blending of more than one color to create the desired color. For example, to display a 50 percent red color, the display system can display a 100 percent red color for 50 percent of the time and display no color for the remaining 50 percent of the time. The human eye will integrate the output of the display system into a 50 percent red color.

In some situations, a representation of an input color vector that uses darker colors may be preferred over a representation that uses only brighter colors or a combination of both darker and brighter colors. For example, when dark colored pixels are displayed, the use of representations of output color vectors using only colors that are darker can yield an improved quality image.

SUMMARY OF THE INVENTION

These and other problems are generally solved or circumvented, and technical advantages are generally achieved, by embodiments of the present invention which provides a system and a method for generating multiprimary signals with optimization for bit depth for use in display devices.

In accordance with an embodiment, a method for generating an output color signal from an input color signal is provided. The method includes converting the input color signal into an output color signal, wherein a number of colors in the output color signal is less than a number of colors used in a display system, in response to a determination that a weighting of the input color signal is less than a specified threshold, and converting the input color signal into an output color signal, wherein a number of colors in the output color signal is equal to the number of colors used in the display system, in response to a determination that a weighting of the input color signal is greater than a specified threshold.

In accordance with another embodiment, a method for displaying an image is provided, where the image is comprised of multiple color signals. The method includes receiving an input color signal, retrieving an output color signal corresponding to the input color signal and based on a weighting of the input color signal, and displaying the output of the color signal. The output color signal is stored in a memory of a system used to display the image.

In accordance with another embodiment, a display system is provided. The display system includes a light source, an array of light modulators optically coupled to the light source, and a controller coupled to the array of light modulators and the light source. The display system also includes a memory coupled to the controller, the memory stores a set of output color vectors that are representative of expected input color vectors. The array of light modulators modulates light from the light source based upon image data to produce images on a display plane. The controller includes a means for determining a weight of an input color vector, a means for selecting an output color vector based on the input color vector and the weight of the input color vector, and a means for commanding the light source to provide light as specified by the output color vector.

An advantage of an embodiment is that the use of colors with high perceived bit depth for input color vectors with weights that are below a specified threshold can help to improve the dither quality since the brighter colors (the colors with low perceived bit depth) can increase dither noise due to their greater brightness.

A further advantage of an embodiment is that the elimination of the low perceived bit depth colors can allow for a redistribution of their display times to the high perceived bit depth colors, potentially increasing image quality.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a multiprimary microdisplay based display system that takes as input three-dimensional color vectors, wherein the microdisplay is a digital micromirror device (DMD). The embodiments may also be applied, however, to display systems using direct view liquid crystal displays, plasma displays, and so forth, or other microdisplay technologies, such as liquid crystal, liquid crystal on silicon, deformable mirror, and so forth. Furthermore, the embodiments can be used in applications that need to generate N-dimensional color vectors from color vectors of smaller dimension, for example, from four-, five-, and so forth dimensional color vectors to N-dimensional color vectors, where N is greater than or equal to, respectively, four, five, and so on.

Figure 1:
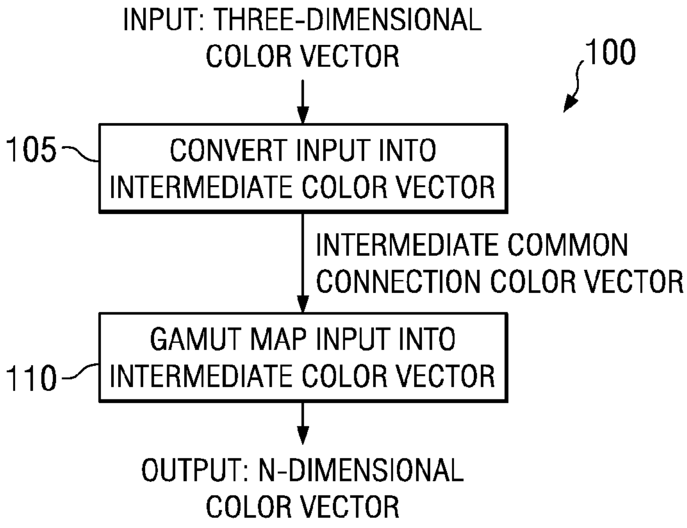
FIG. 1 (PRIOR ART)
FIG. 1 is a diagram of a prior art technique used in converting stimuli with three driving signals (a three-dimensional vector) into stimuli with N driving signals (an N-dimensional vector)

With reference now to FIG. 1, there is shown a diagram illustrating a typical data flow 100 in a prior art technique for use in the conversion of stimuli with three driving signals (commonly presented as three-dimensional color vectors) into stimuli with N driving signals (N-dimensional color vectors) for use in a multiprimary display system. The prior art technique receives, as input the stimuli in the form of three-dimensional color vectors (denoted t), which can be converted into an intermediate color vector (block 105). The intermediate color vectors are in an intermediate common connection color space and must then be converted into the desired N-dimensional color vectors appropriate for display (denoted p) (block 110). The conversion can be expressed as a multiplication of the desired N-dimensional color vector, p, with a system color matrix (denoted A) with dimension 3×N, which contains tristimulus values of the display system. The relationship between t, A, and p can be expressed as $t=A*p$ or $p=A^{-1}*t$. The desired N-dimensional color vector can then be used by the multiprimary display system.

Figure 2:
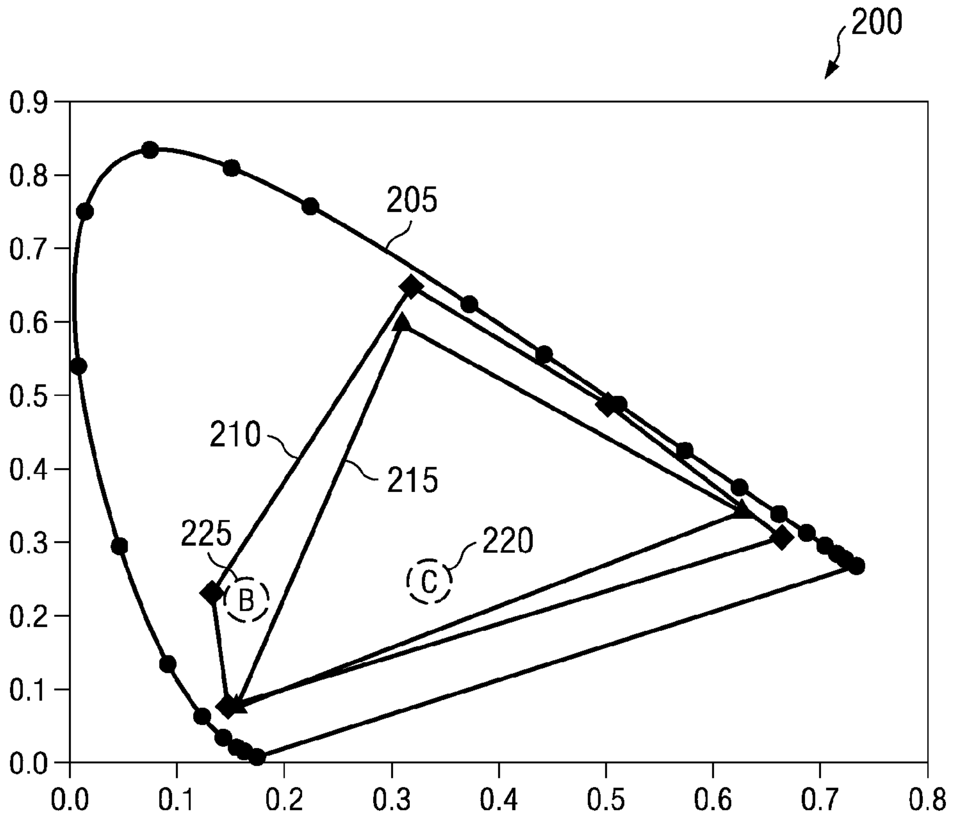
FIG. 2 is an x-y chromaticity chart.

With reference now to FIG. 2, there is shown an x-y chromaticity chart 200. The x-y chromaticity chart 200 illustrates a two-dimensional map of visible colors (shown as curve 205). In addition, the x-y chromaticity chart 200 illustrates displayable colors for an exemplary five-primary display system (shown as a pentagram 210) with primary colors blue, yellow, cyan, red, and green, for example, as well as displayable colors for an exemplary three-primary display system (shown as a triangle 215) with primary colors red, green, and blue, for example. Consider a point inside the triangle 215 (shown as point C 220) that can be expressed as a combination of three weights (one for each color), such as $C=W_R*C_R+W_G*C_G+W_B*C_B$, where $C_R$, $C_G$, and $C_B$ denote chromaticity points of red, green, and blue, respectively, and $W_R$, $W_G$, and $W_B$ denote the amount of each color needed to generate the point C 220. Points inside the pentagram 210 can similarly be expressed as a combination of five colors. In general, points in the triangle 215 or the pentagram 210 can be generated by a large number of combinations of weights. An exception can be points that are in the pentagram 210 that are relatively close to the edge of the pentagram 210, such as point B 225, for example. The point B 225 is close to a vertex of the pentagram 210 that represents pure cyan. The number of combinations that can generate the point B 225 can be fewer than for many other points within the pentagram 210 since the cyan primary has to be used in order to guarantee that the point B 225 is placed at the proper point. This restriction reduces the number of possible combinations for the point.

For example, a pure yellow color can be generated as a combination of primaries (B=0, Y=0, C=0, R=255, G=255), or (B=0, Y=255, C=0, R=0, G=0), or (B=0, Y=255, C=0, R=255, G=0), or (B=0, Y=255, C=0, R=0, G=255), among others. Although many combinations can generate the same color, some combinations will be better than others. For example, some combinations may produce a brighter overall color than others. In a display system, increased brightness may be desired since image quality can be dependent upon image brightness. Additionally, some combinations may produce better results depending upon the chromatic characteristics of the display system. For example, combinations that minimize a transition of energy between primaries can produce images with a lower level of color noise.

The different colors of light used in a display system can have different perceived bit depths. For example, in a multiprimary display system that uses red, green, blue, cyan, and yellow (RGBCY), with a given display time, certain colors (such as yellow and cyan) may have a higher brightness than the other colors (such as red, green, and blue). When combined with dithering and spatio-temporal multiplexing techniques, the darker colors (such as red, green, and blue) require a less sparse spatial and temporal representation, thereby increasing the high frequency nature of their renditions. This can make dither patterns of these colors less visible near the darker end of the color space. This can be desirable, as it positively impacts overall image quality. Consequently, it may appear that the darker colors have a higher perceived bit-depth than the brighter colors.

A display system will typically dither light of differing color, brightness, intensity, and duration to create gray scales and colors that it cannot produce directly. If the dithering is performed correctly, a viewer of the display system will see the gray scale or color that was intended. If not done correctly, the viewer will see significant dither noise. The use of a color (or colors) with higher perceived bit depth (for example, red, green, and blue) can lead to pixels that are spaced closer together spatially and closer together temporally (within the dithered area), since the contribution of the darker colored pixel will be less, which can decrease dither noise. However, the use of a color (or colors) with greater perceived brightness (for example, yellow and cyan) can permit a further spacing of the pixels, since each color will contribute more to the desired gray scale or color, which can increase dither noise.

Therefore, the use of the darker colors in displaying darker colors can reduce dithering noise more than if only the brighter colors are used, since for a given display time, the contribution of the dark colors to the low brightness input colors will be greater than the contribution of the bright colors. The smaller contribution of the darker colors can allow for the use of greater quantities of the darker colors with a finer distribution throughout the dither area, yielding a better quality dither.

Figure 3:
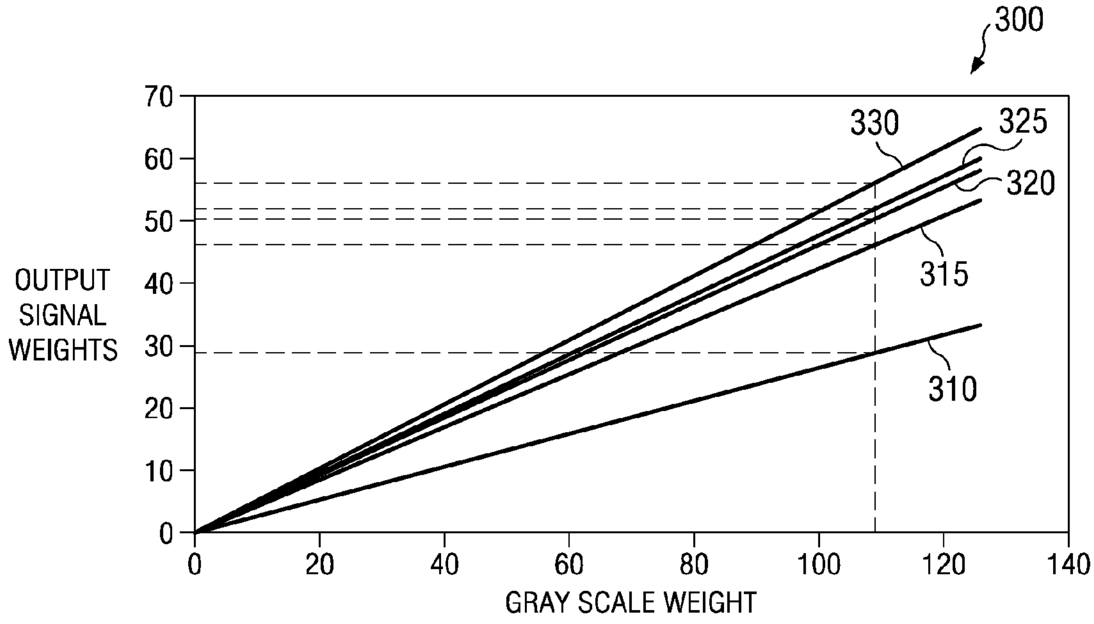
FIG. 3 is a data plot of an exemplary mapping between input gray scale weights and output signal weights for a variety of colors used in a multiprimary display system.

With reference now to FIG. 3, there is shown a data plot 300 illustrating an exemplary mapping between input gray scale weights and output signal weights for a variety of colors used in a multiprimary display system. The data plot 300 illustrates an exemplary mapping between input gray scales and output color signal weights that can be used to produce the gray scales. Similar data plots can be created to display exemplary mappings for various shades of colors. Given a gray scale with a certain weight, which in FIG. 3 varies from zero (0) to 127, the data plot 300 displays a mapping to an output color vector that can produce the gray scale. The data plot 300 includes a curve for each color used in the display system, including a red curve 310, a green curve 315, a cyan curve 320, a yellow curve 325, and a blue curve 330.

The slope and the shape of the individual curves can depend on factors such as the characteristics of a light source used in the display system, the chromatic properties of any color filters used, desired color point, and so forth. The curves can then be used to provide a combination of output color signal weights that will produce the desired gray scale. For example, an output color vector of Red=29, Green=46, Cyan=51, Yellow=53, and Blue=56 can be used to produce a display gray scale of weight 110.

In prior art display systems, the mapping between input signal weight and output signal weights will tend to utilize all of the colors of the multiprimary display system. Therefore, with the exception of a small number of colors and gray scales, for example, a pure color, each color in the display system can be used in the production of the gray scales and colors displayed in the multiprimary display system. However, as discussed previously, for a given display time, some colors have greater perceived bit depth than others. Therefore, their use can result in improved image quality.

Figure 4:
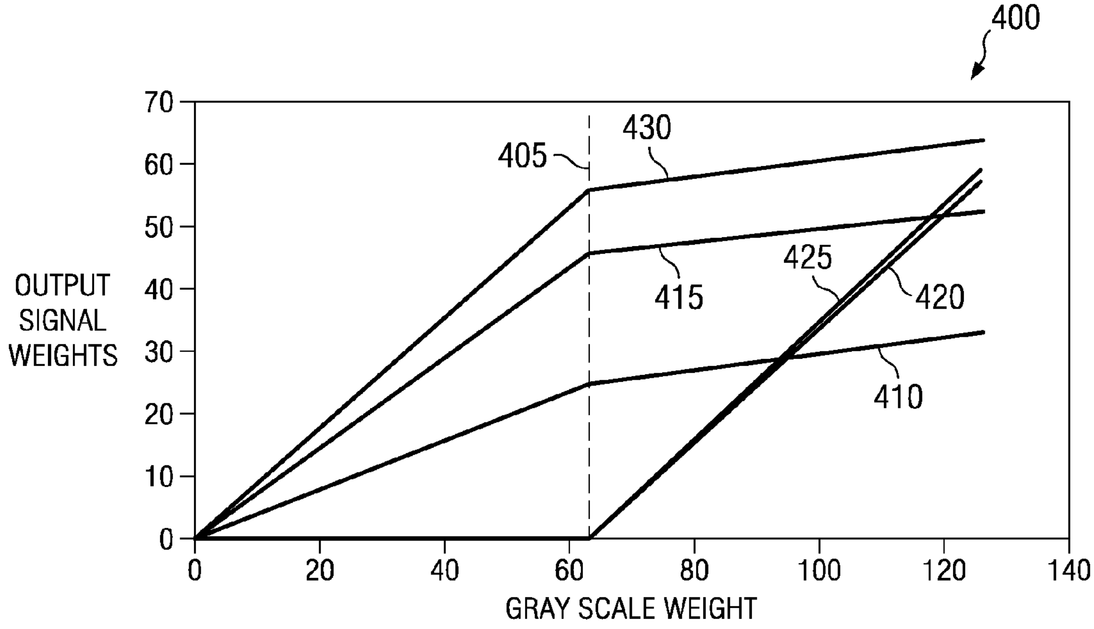
FIG. 4 is a data plot of an exemplary mapping between input gray scale weights and output signal weights for a variety of colors used in a multiprimary display system, wherein for input signal weights below a specified threshold, the output signal weights for colors with lower perceived bit depth are set to zero.

With reference now to FIG. 4, there is shown a data plot 400 illustrating an exemplary mapping between input gray scale weights and output signal weights for a variety of colors used in a multiprimary display system, wherein for input signal weights below a specified threshold, the output signal weights for colors with less perceived bit depth are set to zero. The data plot 400 illustrates an exemplary mapping between input gray scales and output color signal weights that can be used to produce the gray scales. However, to help improve image quality by reducing dither noise, the colors with low perceived bit depth (colors yellow and cyan in this exemplary multiprimary display system) are not used to generate gray scales with weights less than a specified threshold, for example, a weight less than 64 (shown as a vertical line 405).

The data plot 400 includes a curve for each color used in the multiprimary display system, including a red curve 410, a green curve 415, a cyan curve 420, a yellow curve 425, and a blue curve 430. The curves shown in the data plot 400 can change slope and/or shape below and above the specified threshold 405, since the curves below the specified threshold display the amounts of light needed to create the input gray scale without the eliminated colors and the curves above (and potentially including) the specified threshold display the amounts of light needed to create the input gray scale with the eliminated colors.

Although the data plot 400 illustrates a mapping for an exemplary multiprimary display system wherein the colors yellow and cyan are not used, other colors and/or color combinations may be selected for elimination when the input vectors are below the specified threshold. For example, in another mapping only one color can be eliminated or more than two colors can be eliminated. Additionally, in a different display system, other colors may be chosen for elimination. Therefore, the elimination of the specific colors yellow and cyan in this embodiment should not be construed as being limiting to either the scope or the spirit of the invention.

According to an embodiment, input vectors that are below the specified threshold can be produced using a subset of the available colors in the multiprimary display system. As shown in the data plot 400, for input gray scales with weights less than 64, the colors yellow and cyan are eliminated and only the colors red, blue, and green are used to produce the gray scales. The precise value of the specified threshold can vary depending on the light source used in the multiprimary display system, the optical system of the multiprimary display system, the desired color point, and so forth, and can be determined by experimentation. For example, the specified threshold can be increased until the lack of the eliminated colors can be noticed visually and decreased until the dither noise can become objectionable.

As shown in FIG. 4, if an input gray scale has a weight that is lower than the specified threshold, then the output color vector can be expressed as a function of the three colors: red, green, and blue. If an input gray scale has a weight that is higher than or equal to the specified threshold, then the output color vector can be expressed as a function of the five colors: red, green, blue, yellow, and cyan. In an alternate embodiment, the output color vector can be expressed as a function of the three colors if the input gray scale has a weight that is less than or equal to the specified threshold, else the output color vector can be expressed as a function of the five colors.

In yet another embodiment, multiple specified thresholds can be used. For example, if the weight of the input vector is below a first specified threshold, both the yellow color and the cyan color can be eliminated, then if the weight of the input vector is above the first specified threshold but below a second specified threshold, the yellow color can be used but the cyan color can remain eliminated. Finally, if the weight of the input vector is above the second specified threshold, both the yellow color and the cyan color can be used. A variety of embodiments can be derived by changing the condition of the conditional comparisons at the different specified thresholds, for example, changing a strictly less than comparison to a less than or equal to comparison, a strictly greater than comparison to a greater than or equal to comparison, and so forth, or selecting which eliminated color to bring back into use as different weight thresholds are crossed.

The discussion provided below will focus on the conversion of a three-dimensional color vector into an N-dimensional color vector for display in a multiprimary display system that makes use of N colors. Out of the N colors, K of the colors can be eliminated if the weight of the three-dimensional color vector is less than a specified threshold. It is preferred, however, not necessary, that (N-K) be greater than or equal to three (3). Although the discussion focuses on a dual-stage algorithm with a single specified threshold, the embodiment can be readily be extended to a multi-stage algorithm with multiple specified thresholds by those of ordinary skill in the art.

Figure 5:
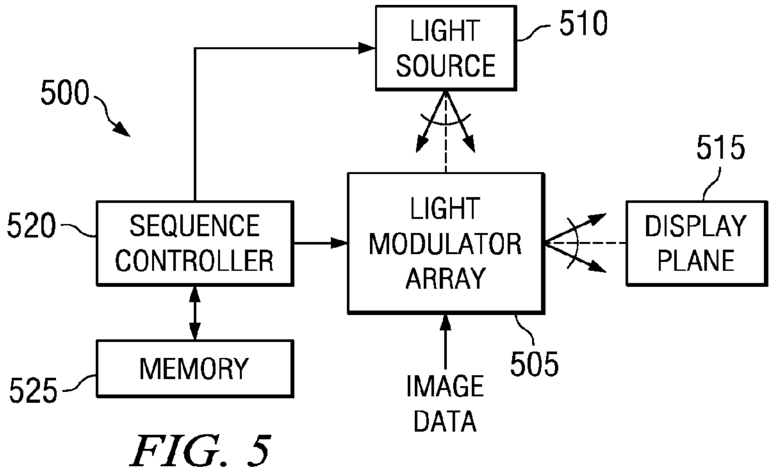
FIG. 5 is a diagram of an exemplary display system.

With reference now to FIG. 5, there is shown a diagram illustrating an exemplary display system 500. The display system utilizes a spatial light modulator, more specifically, an array of light modulators 505, wherein individual light modulators in the array of light modulators 505 assume a state corresponding to image data for an image being displayed by the display system 500. The array of light modulators 505 is preferably a digital micromirror device (DMD) with each light modulator being a positional micromirror. For example, in display systems where the light modulators in the array 505 are micromirror light modulators, then light from a light source 510 can be reflected away from or towards a display plane 515. A combination of the reflected light from all of the light modulators in the array of light modulators 505 produces an image corresponding to the image data.

A sequence controller 520 coordinates the loading of the image data into the array of light modulators 505, controls the light source 510, and so forth. The display system 500 also includes a memory 525 that can be used to store selected N-dimensional and (N-K)-dimensional color vector representations of various input color vectors. Depending upon an input color vector, the sequence controller 520 can retrieve a selected N-dimensional or (N-K)-dimensional color vector representation of the input color vector and use the selected N-dimensional or (N-K)-dimensional color vector to display the input color vector. Since the selection of the N-dimensional and the (N-K)-dimensional color vector representations are made a priori and stored in the memory 525, the requirement for a sequence controller 520 with adequate processing power to make the selection in real-time can be relaxed.

Also, multiple sets of selected N-dimensional and (N-K)-dimensional color vector representations can be made and stored in the memory 525 to enable the use of optimally selected N-dimensional and (N-K)-dimensional color vector representations under different operating conditions, such as different operating environments, chromatic characteristics of the light source 510, lighting conditions, display settings, and so on.

The sequence controller 520 can include a weight calculating unit (not shown) that can be used to calculate a weighting of an input color vector. Based on the weighting and the input color vector, a selecting unit (also not shown) in the sequence controller can select an output color vector. The output color vectors can be stored in the memory 525. The selecting unit of the sequence controller 520 can include a weight comparison unit (not shown) for use in comparing the weighting of the input color vector against a specified threshold and a second selecting unit (not shown) that can select the output color vector from the memory 525 with the selection being based on an output of the weight comparison unit. The sequence controller 520 can also include a light control unit (not shown), which can be used to provide light commands to the light source 510, wherein the light commands are as specified by the selected output color vector.

In the display system 500, when an (N-K)-dimensional color vector is being displayed, the display system 500 can pivot the micromirrors in the array of light modulators 505 so that light would reflect away from the display plane 515 when one of the K colors that have been eliminated is being provided by the light source 510. Alternatively, the time dedicated to displaying an (N-K)-dimensional color vector can be recalculated and allocated to the (N-K) colors being used to display the (N-K)-dimensional color vector. For example, in a five-color multiprimary display system, if two of the five colors are eliminated for certain color vectors, then the display time originally intended for the two eliminated colors can be distributed to display the remaining three colors. In yet another alternative, if the light source 510 can switch rapidly between an on state and an off state, the sequence controller 520 can switch off the light source 510 when the display system 500 would normally display an eliminated color. This can allow the sequence controller 520 to go ahead and preload the array of light modulators 505 with image data to be displayed for a subsequent color or color vector.

Figure 6A:
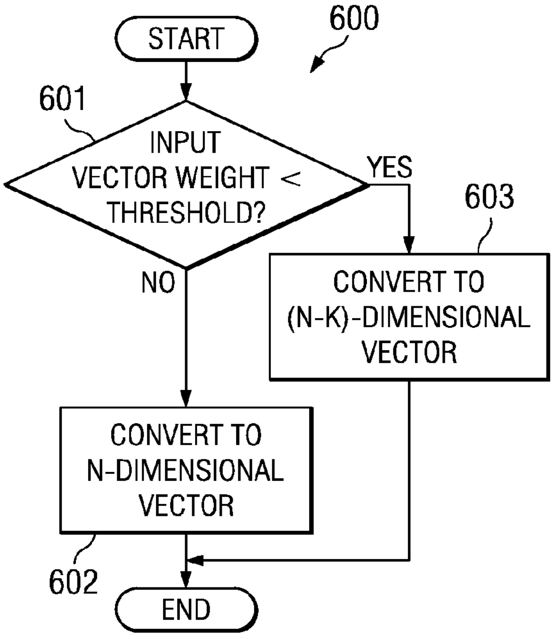
FIGS. 6*a* through 6*c* are diagrams of a selection algorithm and algorithms for converting a three-dimensional color vector into an N-dimensional color vector and an (N-K)-dimensional color vector.
Figure 6B:
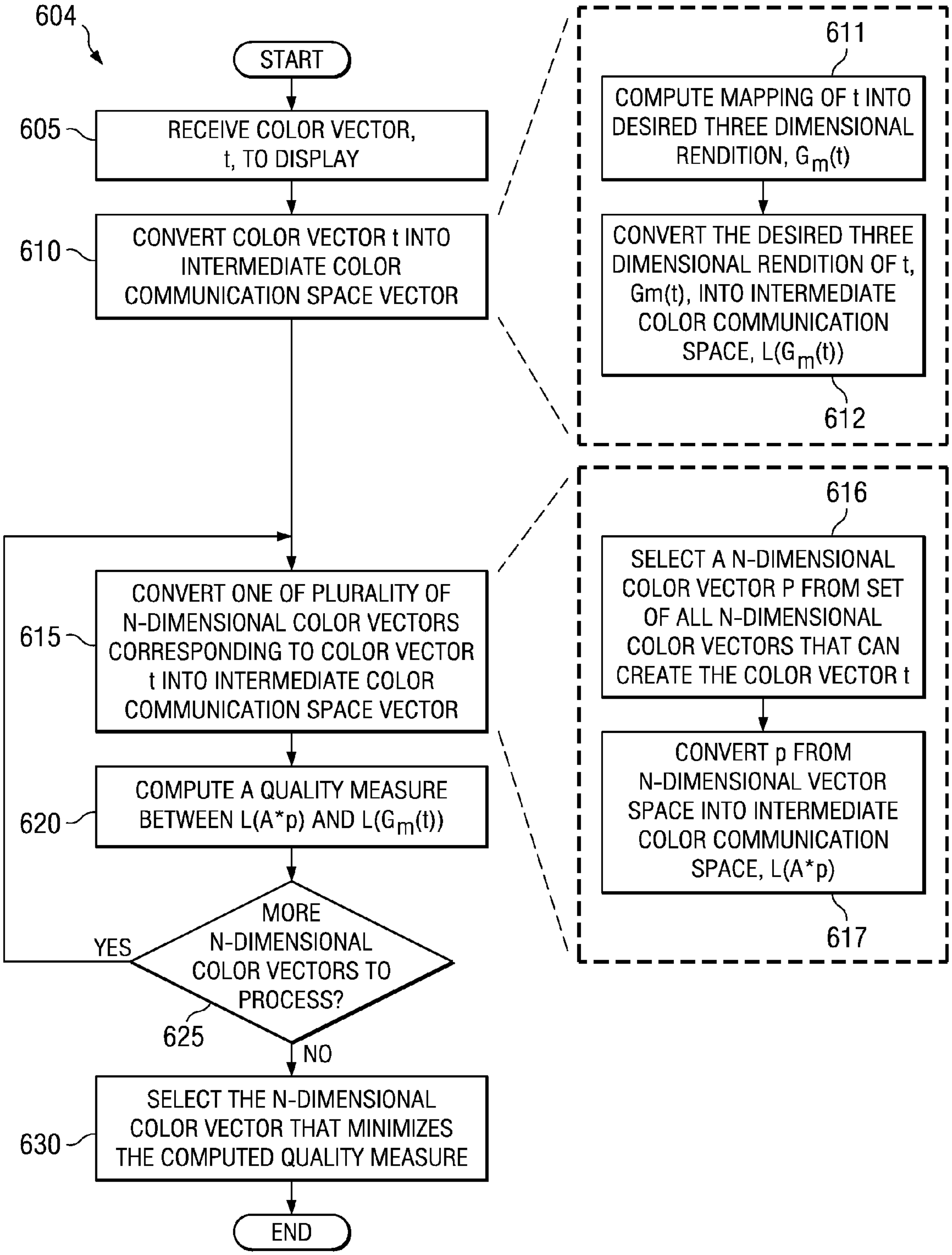
Figure 6C:
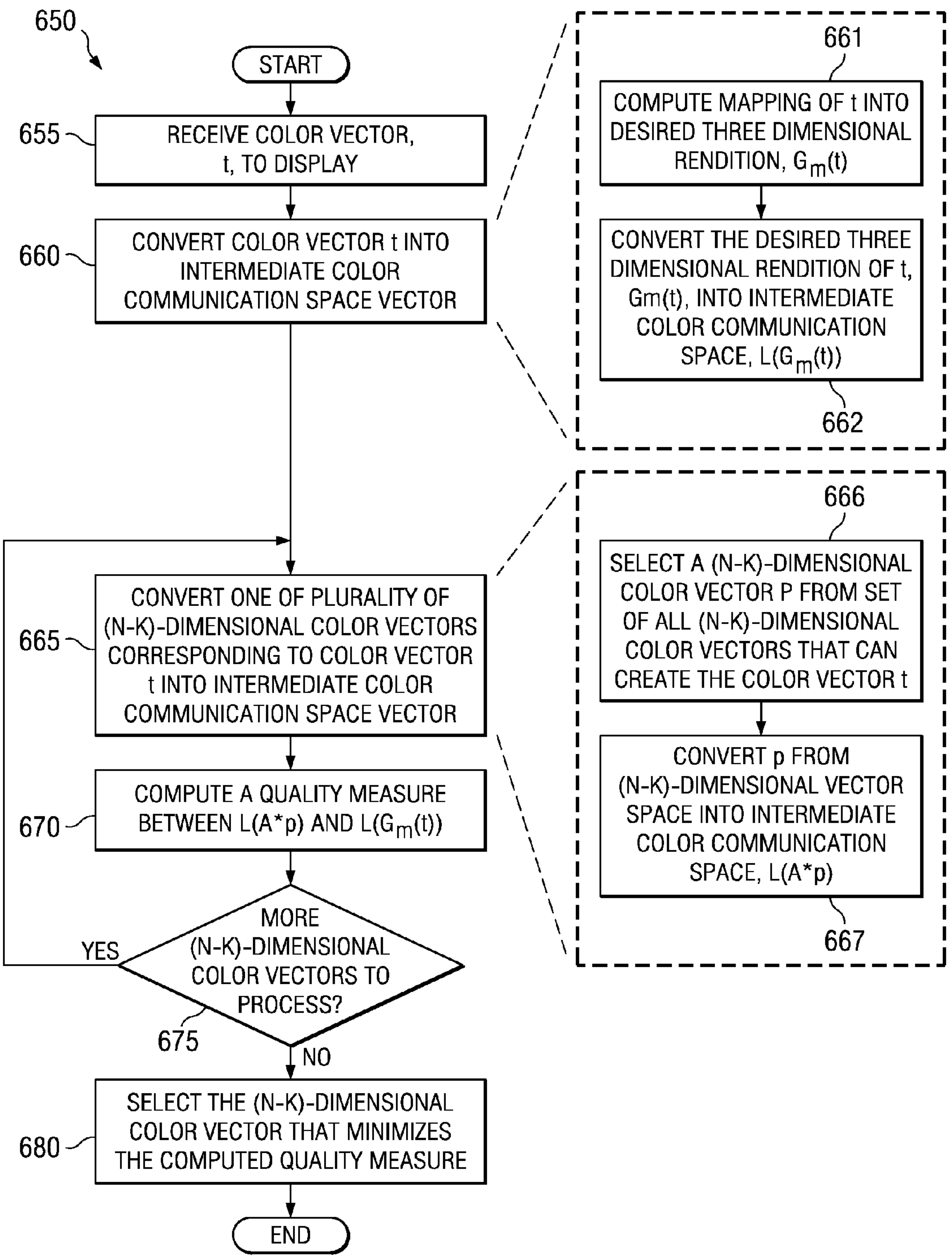

With reference now to FIGS. 6*a* through 6*c*, there are shown flow diagrams illustrating a selection algorithm 600 (FIG. 6*a*) and algorithms used in converting a three-dimensional color vector into an N-dimensional color vector (algorithm 604, FIG. 6*b*) and a three-dimensional color vector into an (N-K)-dimensional color vector (algorithm 650, FIG. 6*c*). In the co-assigned U.S. patent application, entitled “System and Method to Generate Multiprimary Signals,” filed Apr. 13, 2006, Ser. No. 11/403,493, a method for converting a 3-dimensional color vector into an N-dimensional color vector is provided, wherein N is the number of colors in a multiprimary display system and can be an integer value greater than or equal to three. The method provides for the optimization of the conversion process to reduce pulse-width modulation (PWM) noise by considering the amount of energy transferred between neighboring N-dimensional vectors as well as a change in phase between neighboring N-dimensional vectors.

The selection algorithm 600 can make use of a weight of the three-dimensional color vector to determine the dimension of the output color vector (either N-dimensional or (N-K)-dimensional). If the weight of the three-dimensional color vector is greater than or equal to the specified threshold (block 601), then the three-dimensional color vector should be converted into an N-dimensional color vector via the algorithm 604 (block 602), while if the weight of the three-dimensional color vector is less than the specified threshold (block 601), then the three-dimensional color vector should be converted into an (N-K)-dimensional color vector via the algorithm 650 (block 603).

While the description of the algorithms 604 and 650 focuses on the conversion of a three-dimensional input color vector, the algorithms 604 and 650 have applicability to input color vectors with dimensions other than three. Therefore, if the input color vector is four-dimensional, then the value of N should then be greater than or equal to four, for example.

According to an embodiment, the algorithms 604 and 650 can be an application or program executing on a controller responsible for controlling the operation of the display system, wherein the controller can be a microcontroller, processing element, an application specific integrated circuit, a general purpose processing unit, and so forth. The algorithms 604 and 650 can also be implemented in firmware or hardware.

The selection algorithm 600 can, with minor changes that can be self-evident to those of ordinary skill in the art, be applied to a real-time application that converts an input color vector to an output color vector with dimension based on a weighting of the input color vector. For example, after receiving an input color vector and determining its weighting, a conversion of the input color vector can produce an (N-K)-dimensional output color vector if the weighting of the input color vector is less than a specified threshold and an N-dimensional output color vector if the weighting of the input color vector is not less than the specified threshold.

With reference now to FIG. 6*b*, after receiving the color vector t (block 605), the controller will convert the color vector t into an intermediate color communication space color vector (block 610). According to an embodiment, the conversion of the color vector t, which is a three-dimensional color vector, for example, into an intermediate color communication space color vector includes a mapping of the color vector t into its desired three-dimensional rendition, $G_m(t)$ (block 611). A typical mapping involves a color gamut mapping process, which is considered to be well understood by those of ordinary skill in the art. A survey of the fundamentals of gamut mapping is presented in a paper entitled "The Fundamentals of Gamut Mapping: A Survey," written by Jan Morovic and M. Ronnier Luo, which paper is hereby incorporated herein by reference. After mapping the color vector t into its desired three-dimensional rendition, the three-dimensional rendition of the color vector t, $G_m(t)$, can be converted into its intermediate color communication space equivalent, $L(G_m(t))$ (block 612). Preferably, the intermediate color communication space is a three-dimensional perceptual color space. The L(.) operation that converts the three-dimensional rendition of the color vector t, $G_m(t)$, into its intermediate color communication space equivalent is a representation in a common perceptual uniform color space, such as the CIE LAB or CIE LUV color spaces, for example. The CIE LAB and the CIE LUV color spaces are considered to be well understood by those of ordinary skill in the art and will not be discussed herein.

The controller can convert a selected N-dimensional color vector p into its intermediate color communications space color vector equivalent (block 615). As discussed previously, a single three-dimensional color vector can typically be represented by a plurality of N-dimensional color vectors, with an actual number potentially being dependent upon the color vector's position in a chromaticity plot. For example, a color vector with a position closer to the middle of the chromaticity plot can be represented with a larger number of N-dimensional color vectors than a color vector with a position immediately adjacent to a boundary of the chromaticity plot.

According to an embodiment, the conversion of the selected N-dimensional color vector p into its intermediate color communication space color vector equivalent includes selecting an N-dimensional color vector p from a plurality of N-dimensional color vectors that are capable of representing the color vector t (block 616). After selecting the N-dimensional color vector p, the controller can convert the selected N-dimensional color vector p into its intermediate color communication space color vector equivalent, L(A*p) (block 617).

The conversion of the color vector t and the N-dimensional color vector p into their intermediate color communication space color vector equivalents (blocks 610 and 615) can permit a direct comparison of the two color vectors. The controller can then compute a quality measure between the intermediate color communication space color vector equivalent of the color vector t, $(L(G_m(t)))$, and the intermediate color communication space color vector equivalent of the N-dimensional color vector p, (L(A*p)), that can be used to provide information regarding the quality of the match between the two vectors (block 620). According to an embodiment, the quality measure can be a simple squared norm of the difference between L(A*p) and $L(G_m(t))$. An alternate difference may be a weighted difference that can scale the various components (such as lightness, chroma, hue, and so forth) of the intermediate color communication space color vector based on conventional color difference measures, which can have a greater impact on the overall quality of the images being displayed. Other quality measures are possible. A detailed discussion of several preferred quality measures is presented below.

After the quality measure has been computed, a check can be made by the controller to determine if there are more N-dimensional color vectors that should be processed (block 625). If there are additional N-dimensional color vectors that should be processed, the controller can return to block 615 to convert another N-dimensional color vector. This can be repeated until there are no longer any additional N-dimensional color vectors or a computation limit has been reached. Since the computations performed by the controller can require a significant amount of processing power, a limit may need to be put on the number of N-dimensional color vectors that are processed. For example, if the controller has a limited amount of processing power or if the amount of time permitted to find a suitable N-dimensional color vector is limited, then the controller may be forced to process only a small number of N-dimensional color vectors. Once there are no more N-dimensional color vectors to process, the controller can select the N-dimensional color vector that had the best quality measure that was computed in block 620 (block 630). This N-dimensional color vector is the chosen N-dimensional color vector representing the color vector t. The algorithm 600 is a minimization algorithm that will minimize the quality measure computed in block 620 for the plurality of N-dimensional color vectors p. Alternatively, the algorithm 600 can be a maximization algorithm that will maximize a negative of the quality measure. Therefore, the algorithm 600 can be considered to be an optimization algorithm of the quality measure. The minimization performed by the algorithm 600 can be expressed as:

$$\underset{p}{\arg\min}\ (\text{quality measure}).$$

With reference now to FIG. 6*c*, after receiving the color vector t (block 655), the controller will convert the color vector t into an intermediate color communication space color vector (block 660). According to an embodiment, the conversion of the color vector t, which is a three-dimensional color vector, for example, into an intermediate color communication space color vector includes a mapping of the color vector t into its desired three-dimensional rendition, $G_m(t)$ (block 661). A typical mapping involves a color gamut mapping process, which is considered to be well understood by those of ordinary skill in the art. After mapping the color vector t into its desired three-dimensional rendition, the three-dimensional rendition of the color vector t, $G_m(t)$, can be converted into its intermediate color communication space equivalent, $L(G_m(t))$ (block 662). Preferably, the intermediate color communication space is a three-dimensional perceptual color space. The L(.) operation that converts the three-dimensional rendition of the color vector t, $G_m(t)$, into its intermediate color communication space equivalent is a representation in a common perceptual uniform color space, such as the CIE LAB or CIE LUV color spaces, for example.

The controller can convert a selected (N-K)-dimensional color vector p into its intermediate color communications space color vector equivalent (block 665). As discussed previously, a single three-dimensional color vector can typically be represented by a plurality of (N-K)-dimensional color vectors, with an actual number potentially being dependent upon the color vector's position in a chromaticity plot. For example, a color vector with a position closer to the middle of the chromaticity plot can be represented with a larger number of (N-K)-dimensional color vectors than a color vector with a position immediately adjacent to a boundary of the chromaticity plot.

According to an embodiment, the conversion of the selected (N-K)-dimensional color vector p into its intermediate color communication space color vector equivalent includes selecting an (N-K)-dimensional color vector p from a plurality of (N-K)-dimensional color vectors that are capable of representing the color vector t (block 666). After selecting the (N-K)-dimensional color vector p, the controller can convert the selected (N-K)-dimensional color vector p into its intermediate color communication space color vector equivalent, L(A*p) (block 667).

The conversion of the color vector t and the (N-K)-dimensional color vector p into their intermediate color communication space color vector equivalents (blocks 660 and 665) can permit a direct comparison of the two color vectors. The controller can then compute a quality measure between the intermediate color communication space color vector equivalent of the color vector t, ($L(G_m(t))$), and the intermediate color communication space color vector equivalent of the (N-K)-dimensional color vector p, (L(A*p)), that can be used to provide information regarding the quality of the match between the two vectors (block 670). According to an embodiment, the quality measure can be a simple squared norm of the difference between L(A*p) and $L(G_m(t))$. An alternate difference may be a weighted difference that can scale the various components (such as lightness, chroma, hue, and so forth) of the intermediate color communication space color vector based on conventional color difference measures, which can have a greater impact on the overall quality of the images being displayed. Other quality measures are possible. A detailed discussion of several preferred quality measures is presented below.

After the quality measure has been computed, a check can be made by the controller to determine if there are more (N-K)-dimensional color vectors that should be processed (block 675). If there are additional (N-K)-dimensional color vectors that should be processed, the controller can return to block 615 to convert another (N-K)-dimensional color vector. This can be repeated until there are no longer any additional (N-K)-dimensional color vectors or a computation limit has been reached. Since the computations performed by the controller can require a significant amount of processing power, a limit may need to be put on the number of (N-K)-dimensional color vectors that are processed. For example, if the controller has a limited amount of processing power or if the amount of time permitted to find a suitable (N-K)-dimensional color vector is limited, then the controller may be forced to process only a small number of (N-K)-dimensional color vectors. Once there are no more (N-K)-dimensional color vectors to process, the controller can select the (N-K)-dimensional color vector that had the best quality measure that was computed in block 670 (block 680). This (N-K)-dimensional color vector is the chosen (N-K)-dimensional color vector representing the color vector t. The algorithm 650 is a minimization algorithm that will minimize the quality measure computed in block 670 for the plurality of (N-K)-dimensional color vectors p. Alternatively, the algorithm 650 can be a maximization algorithm that will maximize a negative of the quality measure. Therefore, the algorithm 650 can be considered to be an optimization algorithm of the quality measure. The minimization performed by the algorithm 650 can be expressed as:

$$\underset{p}{\arg\min}\,(\text{quality measure}).$$

According to an embodiment, a quality measure that can be minimized by the algorithms 604 and 650 can take into consideration how closely the N-dimensional color vector representation of the color vector t or the (N-K)-dimensional color vector representation of the color vector t matches the color vector t. It is possible to determine how well the N-dimensional color vector representation of the color vector t or the (N-K)-dimensional color vector representation of the color vector t matches the color vector t by computing a Euclidean distance (or some other distance calculation) of a difference between the two vectors, with the quality measure being expressible as $\|L(A*p)-L(Gm(t))\|$.

Another quality measure that can be minimized by the algorithms 604 and 650 can also take into consideration the amount of energy transferred between neighboring N-dimensional color vectors, $p_i$ and $p_j$. The quality measure can then be expressed as $\|L(A*p)-L(Gm(t))\|+TE(p)$, where $$TE(p)=\lambda\sum_{j\in\aleph(p_i)}\|p_i-p_j\|,$$

where $\aleph(p_i)$ denotes a neighborhood immediately about color $p_i$ and $\lambda$ denotes a Lagrange multiplier that can be used as a parameter to set an importance of neighborhood consistency, functioning substantially as a scaling factor.

Yet another quality measure that can be minimized by the algorithms 604 and 650 can also take into consideration a requirement that minimizes a change in a phase between neighboring color vectors. The quality measure can then be expressed as $\|L(A*P)-L(Gm(t))\|+PTE(p)$, where $$PTE(p)=\mu\sum_{j\in\aleph(p_j)}\exp(-p_i\cdot p_j),$$

where $\aleph(p_i)$ denotes a neighborhood immediately about color $p_i$ and $\mu$ denotes an additional Lagrange multiplier that can be used as a parameter to set an importance of phase consistency, functioning substantially as a scaling factor. It is also possible to combine multiple quality measures.

A detailed explanation of the quality measures and their use in optimizing the N-dimensional and (N-K)-dimensional representations of the color vector t can be found in co-assigned U.S. patent application, entitled "System and Method to Generate Multiprimary Signals," filed Apr. 13, 2006, Ser. No. 11/403,493.

Depending upon the nature of the application as well as the capabilities of the controller, it may not be possible for the controller to select an N-dimensional color vector or a (N-K)-dimensional color vector to represent the color vector t in the amount of time permitted to perform the selecting. For example, in a video display system, the selection will need to be performed in real-time and the controller may not have adequate processing power to complete the selection in real-time. Therefore, it may be necessary to pre-select the N-dimensional color vector and (N-K)-dimensional color vector representations for the color vectors that will be provided as an input to the display system and store the pre-selected N-dimensional color vectors and (N-K)-dimensional color vectors in a memory. Then, when the display system receives a particular color vector t at its input, the controller of the display system can simply reference the memory and retrieve the pre-selected N-dimensional color vector or (N-K)-dimensional color vector from storage. Depending upon the size of the memory, the pre-selection of the N-dimensional color vectors and (N-K)-dimensional color vectors may be performed for all possible input color vectors. If the memory size is limited, then the pre-selection can be made for a selected number of input color vectors that are relatively evenly distributed throughout an expected range of input color vectors, for example, and then processing, using standard interpolation techniques, for example, can be added to correct for a difference between the actual input color vector and the one closest to it that is stored in the memory.

Figure 7:
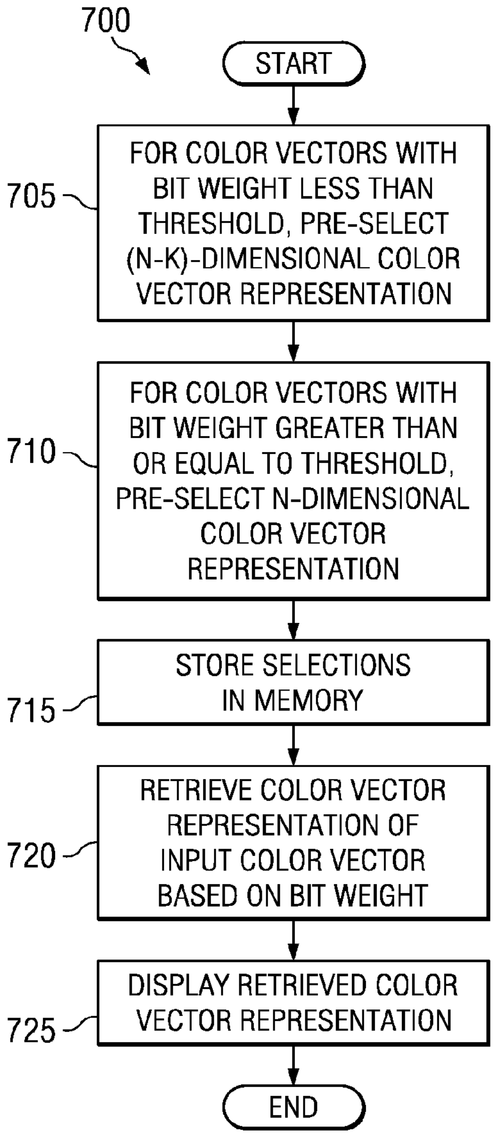
FIG. 7 is a diagram of an algorithm for pre-selecting N-dimensional and (N-K)-dimensional color representations of input color vectors and using the pre-selected N-dimensional and (N-K)-dimensional color representations to display the input color vectors.

With reference now to FIG. 7, there is shown a diagram illustrating an algorithm 700 for use in pre-selecting N-dimensional and (N-K)-dimensional color representations of input color vectors and then using the pre-selected N-dimensional and (N-K)-dimensional color representations to display the input color vectors. As discussed earlier, the selection of an N-dimensional or a (N-K)-dimensional color representation of an input color vector t can be based on the weight of the input color vector t. If the input color vector t has a weight of less than the specified threshold, then a (N-K)-dimensional color vector representation can be selected (block 705), while if the input color vector t has a weight of more than or equal to the specified threshold, then an N-dimensional color vector representation can be selected (block 710). According to an embodiment, the selections made a priori can include variants of the cost function discussed previously. The selections can then be stored in a memory (block 715) for later use. During normal operation of a display system, the stored N-dimensional and (N-K)-dimensional color vector representations of the input color vector t can be retrieved from the memory based on the weight of the input color vector t (block 720). The retrieved N-dimensional or (N-K)-dimensional color vector representation can then be displayed by the display system (block 725).

According to yet another embodiment, for each input color vector t, both an N-dimensional and a (N-K)-dimensional color vector representation can be selected and stored in the memory. By selecting and storing both the N-dimensional and (N-K)-dimensional color vector representations, the weight threshold can be adjusted during actual use of the display system to allow for the optimization of the image quality.

According to another embodiment, multiple sets of N-dimensional and (N-K)-dimensional representations of the input color vectors can be stored in memory. The different sets of representations can allow optimized display system performance for different operating environments, light sources, chromatic settings, and so forth. The storage of a large number of sets can consume a considerable amount of memory, therefore, data compression techniques or other techniques that can help reduce the amount of data storage can be utilized to help reduce memory requirements.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for displaying images in a multiprimary display system using N colors, comprising:

receiving a video input signal representation of pixel intensity and hue using M-dimensional color vectors, where M<N and M and N are positive intergers;

determining an input gray scale weighting of the input signal M-dimensional color vectors;

converting the input signal M-dimensional color vectors into output signal N-dimensional color vectors, including:

if the determined input gray scale weighting is less than a given threshold, converting the input signal M-dimensional color vectors into the output signal N-dimensional color vectors using output signal weightings for N-K of the N colors, where K>=1 and (N-K)>= M, with the output signal weightings of K of the N colors set to zero; and if the determined input gray scale weighting is greater than the given threshold, converting the input signal M-dimensional color vectors into the output signal N-dimensional color vectors using output signal weightings for all of the N colors; and displaying the image in the display system with the N colors using the output signal N-dimensional color vectors with the N-K and N output signal weightings.

2. The method of claim 1, wherein K>1; the given threshold is a first given threshold; and converting the input signal M-dimensional color vectors into the output signal N-dimensional color vectors further includes:

if the determined input gray scale weighting is less than a second given threshold which is less than the first given threshold, converting the input signal M-dimensional color vectors into the output signal N-dimensional color vectors using output signal weightings for N-(K+1) of the N colors, wherein N-(K+1)>=M, with the output signal weightings of K+1 of the colors set to zero; and if the determined weighting is greater than the second given threshold but less than the first given threshold, converting the input signal M-dimensional color vectors into the output signal N-dimensional color vectors using the output signal weightings for the N-K of the N colors.

3. The method of claim 1, wherein N>=5 and M=3.

4. The method of claim 3, wherein the M-dimensional color vectors are red, green and blue color vectors.

5. The method of claim 4, wherein the N colors include cyan and yellow.

6. The method of claim 1, wherein converting the input signal M-dimensional color vectors further includes converting the input signal M-dimensional color vectors into intermediate color vectors in an intermediate common connection color space, and converting the intermediate color vectors into the output signal N-dimensional color vectors.

7. The method of claim 1, wherein converting the input signal M-dimensional color vectors includes:

storing output signal color vector information in memory for both conversions using output signal weightings for only N-K colors and conversions using output signal weightings for all N colors for at least some input signal M-dimensional color vectors;

retrieving the information for conversions using output signal weightings for only N-K colors if the determined input gray scale weighting is less than the given threshold; and retrieving the information for conversions using output signal weightings for all N colors if the determined weighting is greater than the given threshold.

8. The method of claim 7, wherein the display system includes a controller which calculates the input gray scale weighting, compares the calculated weighting with the given threshold, and selects retrieval of the information for conversions using the output signal weightings for the N-K colors or the information for conversions using the output signal weightings for the N colors based on output result of the comparison.

9. The method of claim 8, wherein the display system includes a source of light of the N colors and a spatial light modulator having an array of controllable individual light modulators; and displaying the image includes modulating the light of the N colors by controlling settings of the individual light modulators using the retrieved information.

10. The method of claim 9, wherein the spatial light modulator is a digital micromirror device having an array of micromirrors having position settings controlled using the retrieved information.

11. The method of claim 1, wherein the display system includes a source of light of the N colors and a spatial light modulator having an array of controllable individual light modulators; and displaying the image includes modulating the light of the N colors by controlling settings of the individual light modulators using the conversions with the output signal weightings for only N-K colors when the determined input gray scale weighting is less that the given threshold and using the conversions with the output signal weightings for all N colors when the determined input gray scale weighting is greater than the determined input gray scale weighting.

12. The method of claim 11, wherein the spatial light modulator is a digital micromirror device having an array of micromirrors having position settings controlled using the conversions.

13. The method of claim 1, further comprising setting the given threshold empirically between a lower value determined by decreasing the value until dither noise becomes visually objectionable in the displayed image and an upper value determined by increasing the value until a difference between using output signal weightings for only N-K colors and output signal weightings for all N colors becomes visibly noticeable in the displayed image.

* * * * *